(12) United States Patent
Yoshida et al.

(10) Patent No.: US 11,569,101 B2
(45) Date of Patent: Jan. 31, 2023

(54) FLUID SUPPLY DEVICE AND FLUID SUPPLY METHOD

(71) Applicants: FUJIKIN INCORPORATED, Osaka (JP); TOKYO ELECTRON LTD., Tokyo (JP)

(72) Inventors: Toshihide Yoshida, Osaka (JP); Yukio Minami, Osaka (JP); Tsutomu Shinohara, Osaka (JP)

(73) Assignees: FUJIKIN INCORPORATED, Osaka (JP); TOKYO ELECTRON LTD., Tokyo (JP)

( * ) Notice: Subject to any disclaimer, the term of this patent is extended or adjusted under 35 U.S.C. 154(b) by 443 days.

(21) Appl. No.: 16/634,681

(22) PCT Filed: Jul. 31, 2018

(86) PCT No.: PCT/JP2018/028601
§ 371 (c)(1),
(2) Date: Jan. 28, 2020

(87) PCT Pub. No.: WO2019/031303
PCT Pub. Date: Feb. 14, 2019

(65) Prior Publication Data
US 2021/0125840 A1    Apr. 29, 2021

(30) Foreign Application Priority Data
Aug. 10, 2017   (JP) .............. JP2017-156193

(51) Int. Cl.
*H01L 21/67* (2006.01)
*H01L 21/02* (2006.01)

(52) U.S. Cl.
CPC .... *H01L 21/6715* (2013.01); *H01L 21/02307* (2013.01)

(58) Field of Classification Search
CPC ............. H01L 21/324; H01L 21/67017; H01L 21/67023; H01L 21/67109; H01L 21/6723;
(Continued)

(56) References Cited

U.S. PATENT DOCUMENTS

| | | | |
|---|---|---|---|
| 2001/0050096 A1* | 12/2001 | Costantini ................ | B01J 3/008 134/107 |
| 2004/0018452 A1* | 1/2004 | Schilling ............. | H01L 21/3105 430/314 |
| 2004/0025908 A1* | 2/2004 | Douglas .................. | B01J 3/008 134/56 R |

(Continued)

FOREIGN PATENT DOCUMENTS

| | | |
|---|---|---|
| JP | H0650492 A | 2/1994 |
| JP | 2002-33302 | 1/2002 |

(Continued)

OTHER PUBLICATIONS

Korean Office Action, Korean Patent Office, Application No. 10-2020-7000032, dated Jan. 18, 2021.
International Search Report issued in International Patent Application No. PCT/JP2018/028601, dated Sep. 25, 2018.
International Preliminary Report on Patentability issued in International Patent Application No. PCT/JP2018/028601, dated Feb. 11, 2020.

*Primary Examiner* — Jarrett J Stark
(74) *Attorney, Agent, or Firm* — Greenblum & Bernstein, P.L.C.

(57) ABSTRACT

A fluid supply device and a fluid supply method capable of stably supplying a supercritical fluid includes a fluid supply device for supplying a fluid in a liquid state before being changed to a supercritical fluid toward a processing chamber. The fluid supply device comprises a condenser that condenses and liquefies a fluid in a gas state, a tank that stores the fluid condensed and liquefied by the condenser, a pump that pressure-feeds the liquefied fluid stored in the
(Continued)

tank toward the processing chamber, and a heating means provided to a flow path communicating with a discharge side of the pump and for partially changing the liquid in the flow path to a supercritical fluid.

5 Claims, 6 Drawing Sheets

(58) Field of Classification Search
CPC ......... H01L 21/67098; H01L 21/67248; H01L 21/164; H01L 21/0223–02244; H01L 21/02249; H01L 21/02252; H01L 21/02614; H01L 21/76202–76221
See application file for complete search history.

(56) References Cited

U.S. PATENT DOCUMENTS

| | | | |
|---|---|---|---|
| 2013/0081297 A1 | 4/2013 | Nakashima | |
| 2014/0075984 A1* | 3/2014 | Sugawara | B01D 53/0438 62/606 |

FOREIGN PATENT DOCUMENTS

| | | | |
|---|---|---|---|
| JP | 2004-335675 | 11/2004 | |
| JP | 2006-294662 | 10/2006 | |
| JP | 2012-87983 | 5/2012 | |
| JP | 2013-77610 | 4/2013 | |
| JP | 2013-159499 | 8/2013 | |
| JP | 2014-22520 | 2/2014 | |
| WO | WO-2021159117 A1 * | 8/2021 | ............... C01B 3/08 |

* cited by examiner

FLUID SUPPLY DEVICE AND FLUID SUPPLY METHOD

FIELD OF THE INVENTION

The present invention relates to a fluid supply device and a fluid supply method used in a drying process or the like of various substrates, such as semiconductor substrates, photo mask glass substrates, and liquid crystal display glass substrates.

DESCRIPTION OF THE BACKGROUND ART

A large-scale, high-density, high-performance semiconductor device is manufactured through processes such as coating, etching, rinsing, and drying after formation of resist patterns on a resist formed on a silicon wafer through exposure, development, rinsing, and drying. In particular, a resist is a polymer material sensitive to light, X-rays, electron beams, and the like. Chemical solutions such as a developer and a rinsing solution are used in the development and rinsing processes, and therefore a drying process is essential after the rinsing process.

In this drying process, when a space width between resist patterns formed on the substrate is about 90 nm or less, the problem arises that a Laplace force acts between the patterns due to a surface tension (capillary force) of the chemical solution remaining between the patterns, causing the patterns to collapse. To prevent pattern collapse caused by the action of the surface tension of the chemical solution remaining between patterns, methods of using a supercritical fluid of carbon dioxide as a drying process to reduce the surface tension acting between the patterns are known (Patent Documents 1 to 4, for example).

PATENT DOCUMENTS

Patent Document 1: Japanese Laid-Open Patent Application No. 2014-22520
Patent Document 2: Japanese Laid-Open Patent Application No. 2006-294662
Patent Document 3: Japanese Laid-Open Patent Application No. 2004-335675
Patent Document 4: Japanese Laid-Open Patent Application No. 2002-33302

SUMMARY OF THE INVENTION

Problems to be Solved by the Invention

To supply the supercritical fluid of carbon dioxide to the processing chamber, carbon dioxide (for example, 20° C., 5.0 MPa) in a gas state from a supply source is condensed and liquefied using a condenser, stored in a tank, and pressure-fed to the processing chamber using a pump (for example, 20° C., 20.0 MPa). The carbon dioxide in a liquid state fed to the processing chamber is heated (for example, 80° C., 20.0 MPa) right before the processing chamber or inside the processing chamber to form a supercritical fluid.

Nevertheless, because the carbon dioxide in a liquid state is pressure-fed by the pump in pulsated manner, the pressure of the liquid fluctuates greatly. Thus, a supply amount of carbon dioxide that changes to a supercritical state right before the processing chamber or inside the processing chamber becomes unstable, making it difficult to stably supply the supercritical fluid of carbon dioxide.

An object of the present invention is to provide a fluid supply device and a fluid supply method capable of stably supplying a supercritical fluid.

Means for Solving the Problems

A fluid supply device of the present invention is a fluid supply device for supplying a fluid in a liquid state toward a processing chamber, and comprises:
  a condenser that condenses and liquefies a fluid in a gas state,
  a tank that stores the fluid condensed and liquefied by the condenser,
  a pump that pressure-feeds the liquefied fluid stored in the tank toward the processing chamber, and
  a heating means provided to a flow path that communicates with a discharge side of the pump and for partially changing the liquid in the flow path to a supercritical fluid.

Preferably, a configuration can be adopted in which the fluid supply device further comprises an extended heat transfer tube part having an increased heat transfer area and provided to the flow path that communicates with the discharge side of the pump, and
  the heating means is provided to the extended heat transfer tube part.

A fluid supply method of the present invention comprises a step of using the fluid supply device having the above-described configuration to supply the fluid in a liquid state before being changed to a supercritical fluid toward a processing chamber.

A semiconductor manufacturing system of the present invention processes a substrate using the fluid supply device having the above-described configuration.

Effect of the Invention

According to the present invention, a liquid in an extended heat transfer tube part is heated by a heating means to promptly produce a coexistent state of a liquid and a supercritical fluid in the extended heat transfer tube part, and a pulsation of the liquid is absorbed using a compressibility of the supercritical fluid, making it possible to stably supply a supercritical fluid to a processing chamber.

DESCRIPTION OF THE PREFERRED EMBODIMENTS

Embodiments of the present invention are described below with reference to the drawings.

First Embodiment

Figure 1A:
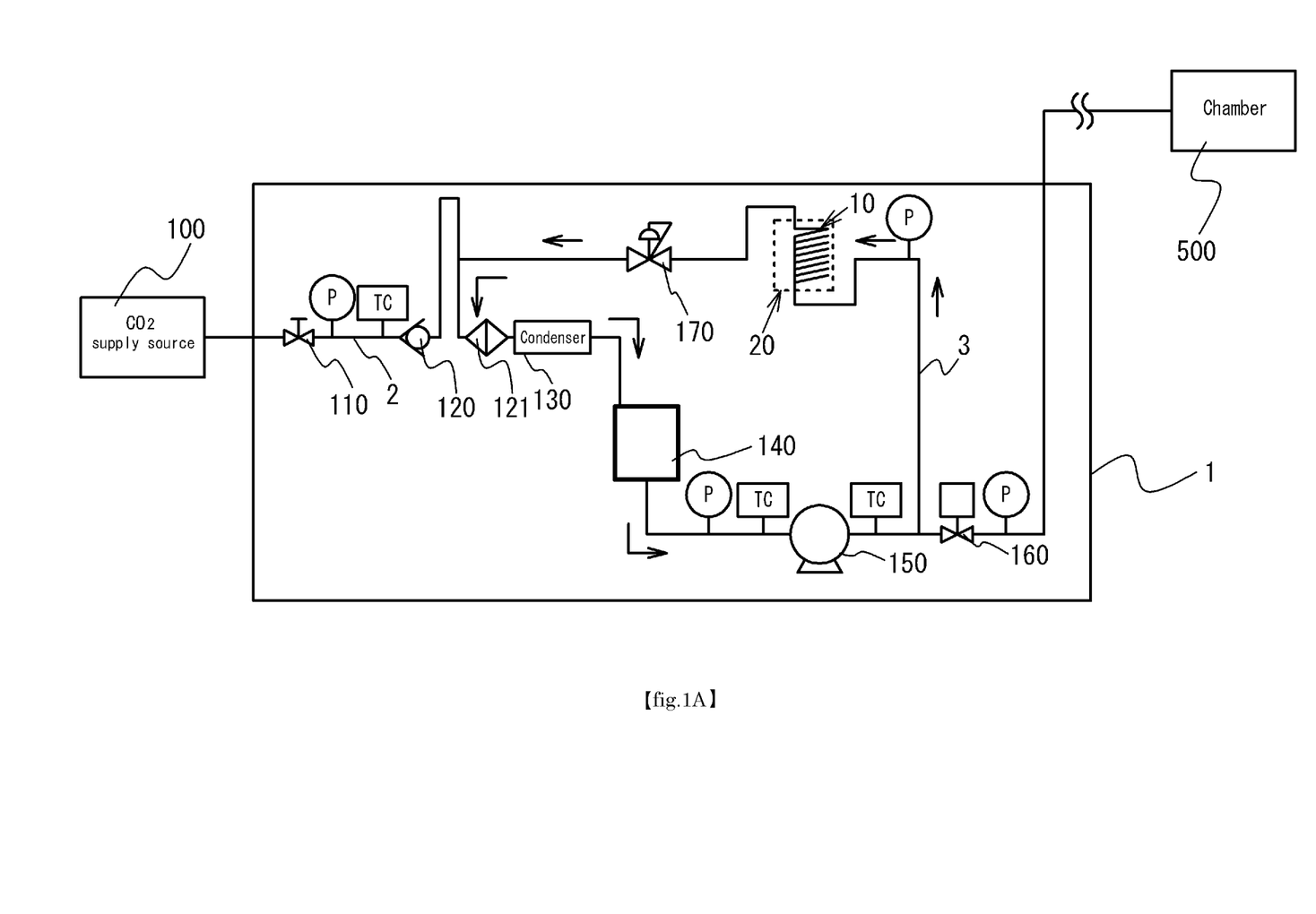
FIG. 1A is a configuration diagram of a fluid supply device according to an embodiment of the present invention, and is a diagram illustrating a state in which a fluid is circulating.
Figure 1B:
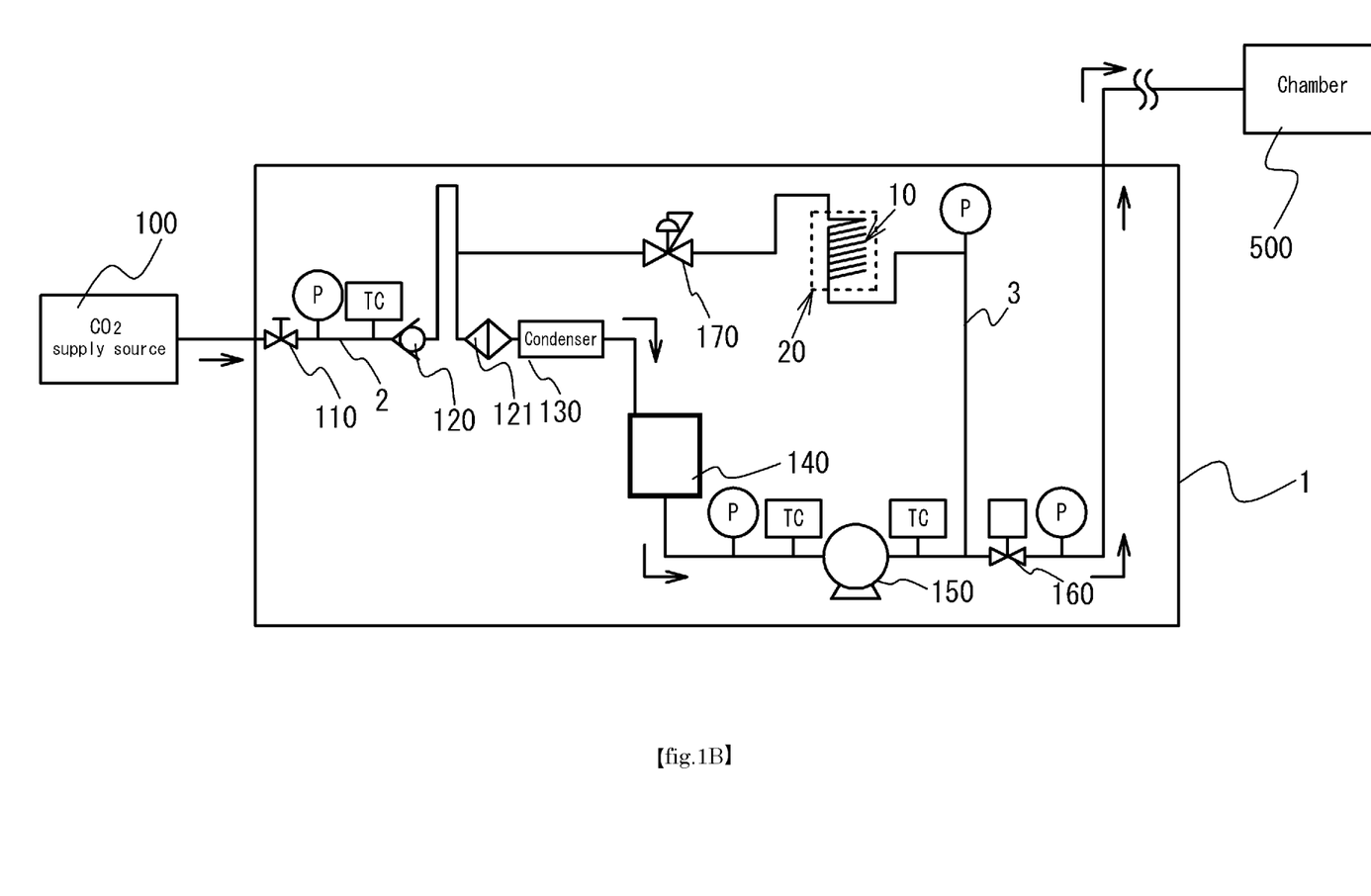
FIG. 1B is a diagram illustrating a state in which a liquid is supplied to a processing chamber in the fluid supply device of FIG. 1A.

FIG. 1A and FIG. 1B illustrate a fluid supply device according to an embodiment of the present invention. In the present embodiment, a case in which carbon dioxide is used as the fluid will be described.

In FIG. 1A and FIG. 1B, 1 denotes a fluid supply device, 10 denotes an extended heat transfer tube part, 20 denotes a heating means (for example, a heater), 100 denotes a $CO_2$ supply source, 110 denotes a switch valve, 120 denotes a check valve, 121 denotes a filter, 130 denotes a condenser, 140 denotes a tank, 150 denotes a pump, 160 denotes an automatic switch valve, 170 denotes a back pressure valve, and 500 denotes a processing chamber. Further, in the drawings, P denotes a pressure sensor, and TC denotes a temperature sensor. FIG. 1A illustrates a state in which the automatic switch valve 160 is closed, and FIG. 1B illustrates a state in which the automatic switch valve 160 is opened.

In the processing chamber 500, a semiconductor substrate such as a silicon wafer is processed. It should be noted that while, in the present embodiment, a silicon wafer is exemplified as a processing target, the processing target is not necessarily limited thereto, and may be another processing target such as a glass substrate.

Figure 2:
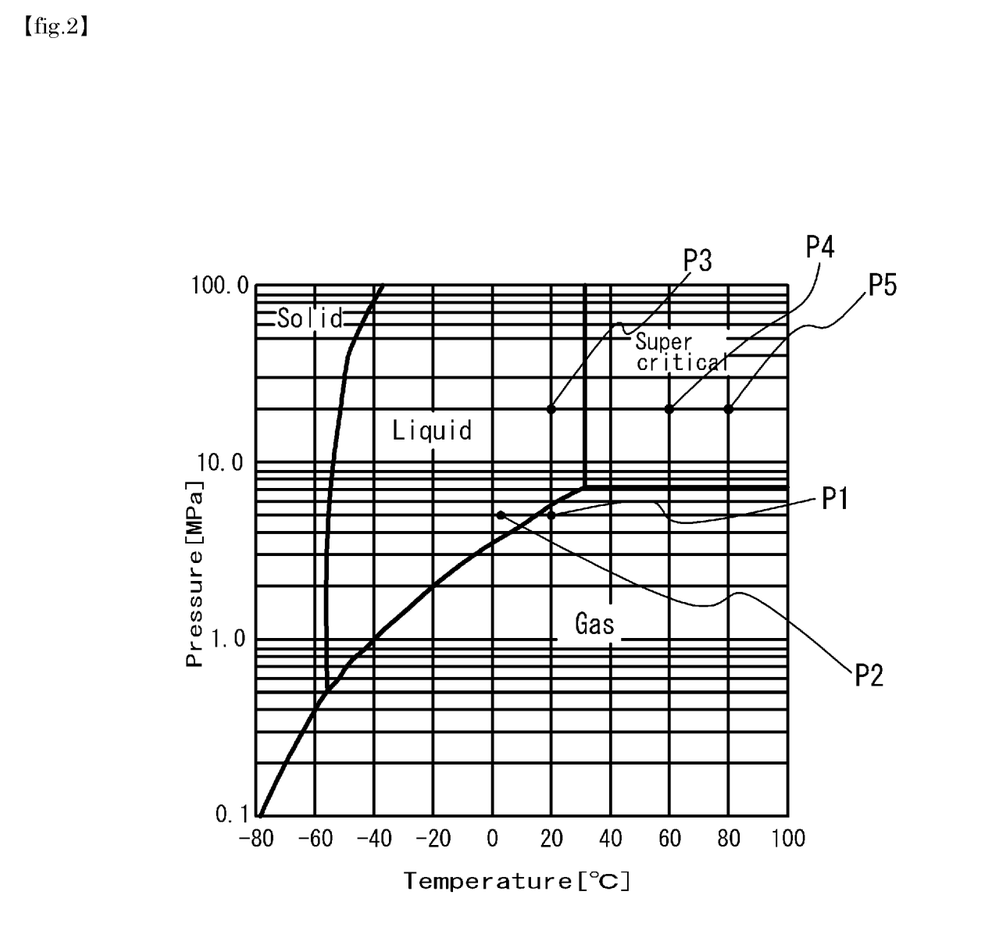
FIG. 2 is a graph showing a state of carbon dioxide.

The $CO_2$ supply source 100 supplies carbon dioxide (for example, 20° C., 5.0 MPa) in a gas state to a main flow path 2. With reference to FIG. 2, the carbon dioxide supplied from the $CO_2$ supply source 100 is in a state of P1 in FIG. 2. The carbon dioxide in this state is fed to the condenser 130 through the switch valve 110, the check valve 120, and the filter 121.

In the condenser 130, the supplied carbon dioxide in a gas state is cooled and thus liquefied and condensed, and the liquefied and condensed carbon dioxide is stored in the tank 140. The carbon dioxide stored in the tank 140 is in a state (3° C., 5 MPa) such as indicated by P2 in FIG. 2. The carbon dioxide in a liquid state such as indicated by P2 in FIG. 2 is fed from a bottom portion of the tank 140 to the pump 150 and pressure-fed to a discharge side of the pump 150, and thus turns into a liquid state (20° C., 20 MPa) such as indicated by P3 in FIG. 2.

The automatic switch valve 160 is provided in a middle of the main flow path 2 connecting the pump 150 and the processing chamber 500. A branching flow path 3 branches from an area between the pump 150 and the automatic switch valve 160 of the main flow path 2. The branching flow path 3 branches from the main flow path 2 between the pump 150 and the automatic switch valve 160, and is connected to the main flow path 2 again on an upstream side of the filter 121. The extended heat transfer tube part 10 and the back pressure valve 170 are provided to the branching flow path 3.

When a pressure of the fluid (liquid) on the discharge side of the pump 150 becomes a setting pressure (for example, 20 MPa) or greater, the back pressure valve 170 releases the liquid to the filter 121 side. Accordingly, the pressure of the liquid on the discharge side of the pump 150 is prevented from exceeding the setting pressure.

With the automatic switch valve 160 closed, the liquid pressure-fed from the pump 150 returns again to the condenser 130 and the tank 140 through the branching flow path 3, as illustrated in FIG. 1A.

When the automatic switch valve 160 is opened, the carbon dioxide in a liquid state is pressure-fed to the processing chamber 500, as illustrated in FIG. 1B. The carbon dioxide in a liquid state thus pressure-fed is heated by a heating means (not illustrated) provided right before the processing chamber 500 or inside the processing chamber 500, and turns into a supercritical state (80° C., 20 MPa) such as indicated by P5 illustrated in FIG. 2.

Here, the liquid discharged from the pump 150 pulsates considerably.

When the liquid discharged from the pump 150 is supplied to the processing chamber 500, the main flow path 2 is filled with the liquid up to the processing chamber 500, and the branching flow path 3 is also filled with liquid up to the back pressure valve 170. Thus, when the liquid discharged from the pump 150 pulsates, the pressure of the carbon dioxide in a liquid state in the main flow path 2 and the branching flow path 3 periodically fluctuates.

Carbon dioxide in a liquid state has poor compressibility. Thus, when the pressure of the carbon dioxide in a liquid state periodically fluctuates, a flow rate of the carbon dioxide in a liquid state supplied to the processing chamber 500 also greatly fluctuates accordingly. When the flow rate of the supplied carbon dioxide in a liquid state greatly fluctuates, a supply amount of the carbon dioxide changed to the supercritical state right before the processing chamber 500 or inside the processing chamber 500 also greatly fluctuates.

Thus, in the present embodiment, the extended heat transfer tube part 10 and the heating means 20 are provided to the branching flow path 3.

Figure 3:
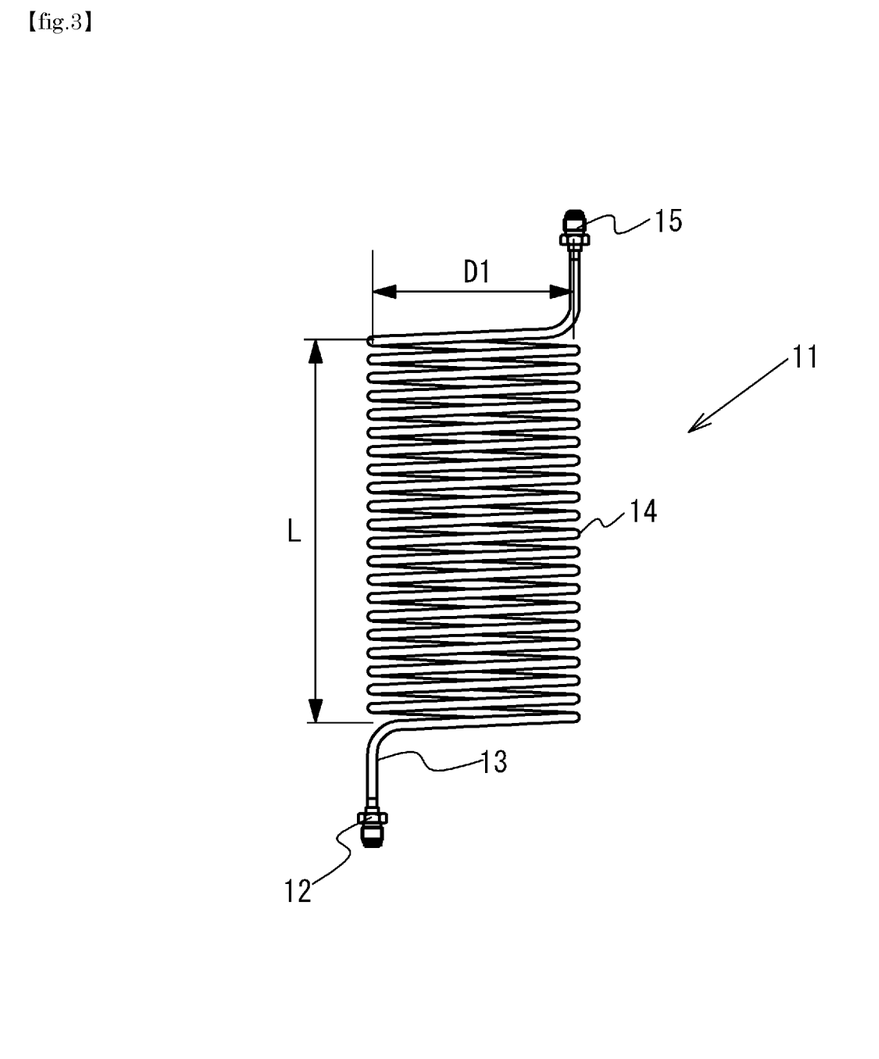
FIG. 3 is a front view illustrating an example of an extended heat transfer tube part.

The extended heat transfer tube part 10 is configured by a spiral tube 11 connected in series to the branching flow path 3 in order to increase the heat transfer area per unit volume greater than that of a normal straight tube.

The spiral tube 11 is provided with pipe joints 12, 15 at a lower end portion and an upper end portion, respectively, and is connected in series to the branching flow path 3 by these pipe joints 12, 15.

A tube 13 constituting the spiral tube 11 is formed of a metal material such as stainless steel, for example. A diameter of the tube 13 is 6.35 mm, a total length L of a spiral part 14 is 280 mm, a diameter D1 of the spiral part 14 is about 140 mm, a number of turns of the spiral part 14 is 22, and a total length of the tube 13 is about 9,800 mm. The present invention is not necessarily limited thereto, and includes a helical tube, a corrugated tube, and the like in addition to the spiral tube. The spiral or helical shape need not be circular, and may be square. Further, the extended heat transfer tube 10 may be a plate type or multi-tube type tube, similar to that used in a heat exchanger.

The heating means 20 heats the extended heat transfer tube part 10, but may be provided so as to cover the extended heat transfer tube part 10 in its entirety or may be provided so as to cover an outer peripheral surface of the spiral tube 11. In short, the heating means 20 may be configured to be capable of heating at least a portion of the extended heat transfer part 10, that is, a portion or all of the spiral tube 11.

The spiral tube 11 of the extended heat transfer tube part 10 is filled with carbon dioxide in a liquid state (the state indicated by P3 in FIG. 2: 20° C., 20 MPa) pressure-fed from the pump 150 when the heating means 20 not operating. Here, when the heating means 20 is operated to heat the liquid in the spiral tube 11, because the heat transfer area is increased, the temperature of the liquid instantaneously rises and at least a portion of the liquid in the spiral tube 11 changes to a supercritical state such as indicated by P4 (60° C., 20 MPa) illustrated in FIG. 2. Carbon dioxide in a supercritical state has high compressibility, and therefore absorbs the pulsation of the liquid discharged from the pump 150. As a result, a supercritical fluid can be stably supplied to the processing chamber 500.

Second Embodiment

Figure 4A:
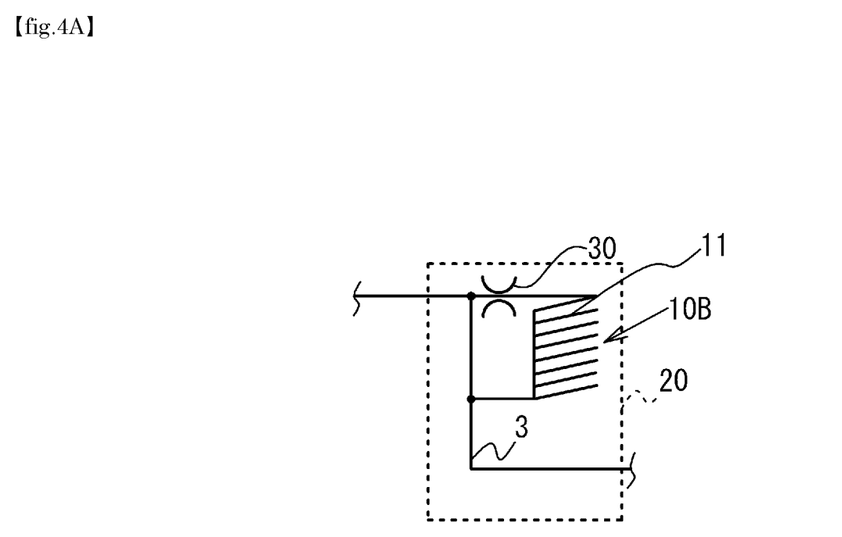
FIG. 4A is a schematic configuration view illustrating another embodiment of the extended heat transfer tube part and a heating means.

FIG. 4A illustrates another embodiment of the extended heat transfer tube part.

In an extended heat transfer tube part 10B illustrated in FIG. 4A, the spiral tube 11 is connected in parallel to the branching flow path 3, and an orifice 30 is provided between the branching flow path 3 and the spiral tube 11.

Even with such a configuration, in the same way as in the first embodiment, it is possible to suppress the pulsation (periodic pressure fluctuation) of the liquid discharged from the pump 150, and stabilize the supply amount of carbon dioxide changed to a supercritical state right before the processing chamber 500 or inside the processing chamber 500.

Third Embodiment

Figure 4B:
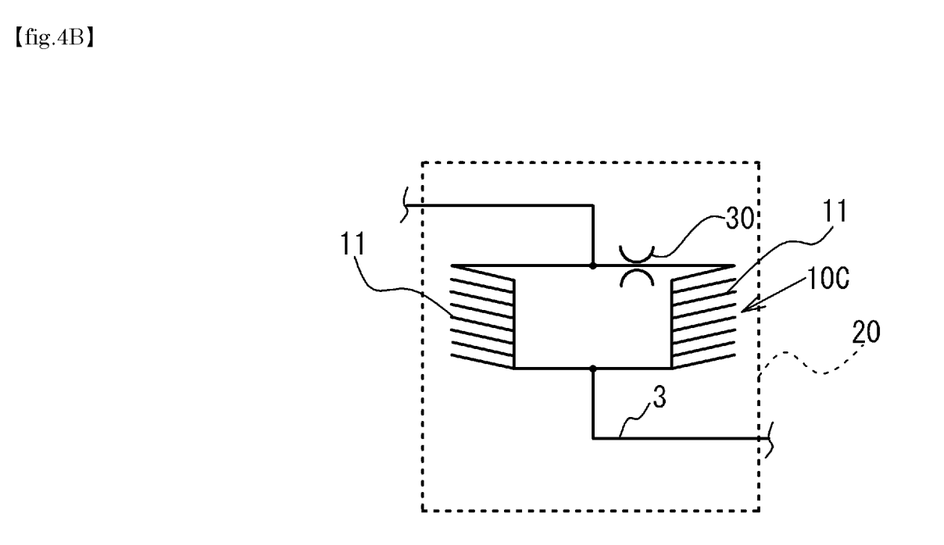
FIG. 4B is a schematic configuration view illustrating yet another embodiment of the extended heat transfer tube part and the heating means.

FIG. 4B illustrates yet another embodiment of the extended heat transfer tube part.

In an extended heat transfer tube part 10C illustrated in FIG. 4B, two of the spiral tubes 11 are connected in parallel and inserted into the branching flow path 3, and the orifice 30 is provided between the branching flow path 3 and one of the spiral tubes 11.

Even with such a configuration, in the same way as in the first embodiment, it is possible to suppress the pulsation (periodic pressure fluctuation) of the liquid discharged from the pump 150, and stabilize the supply amount of carbon dioxide changed to a supercritical state right before the processing chamber 500 or inside the processing chamber 500.

Figure 5:
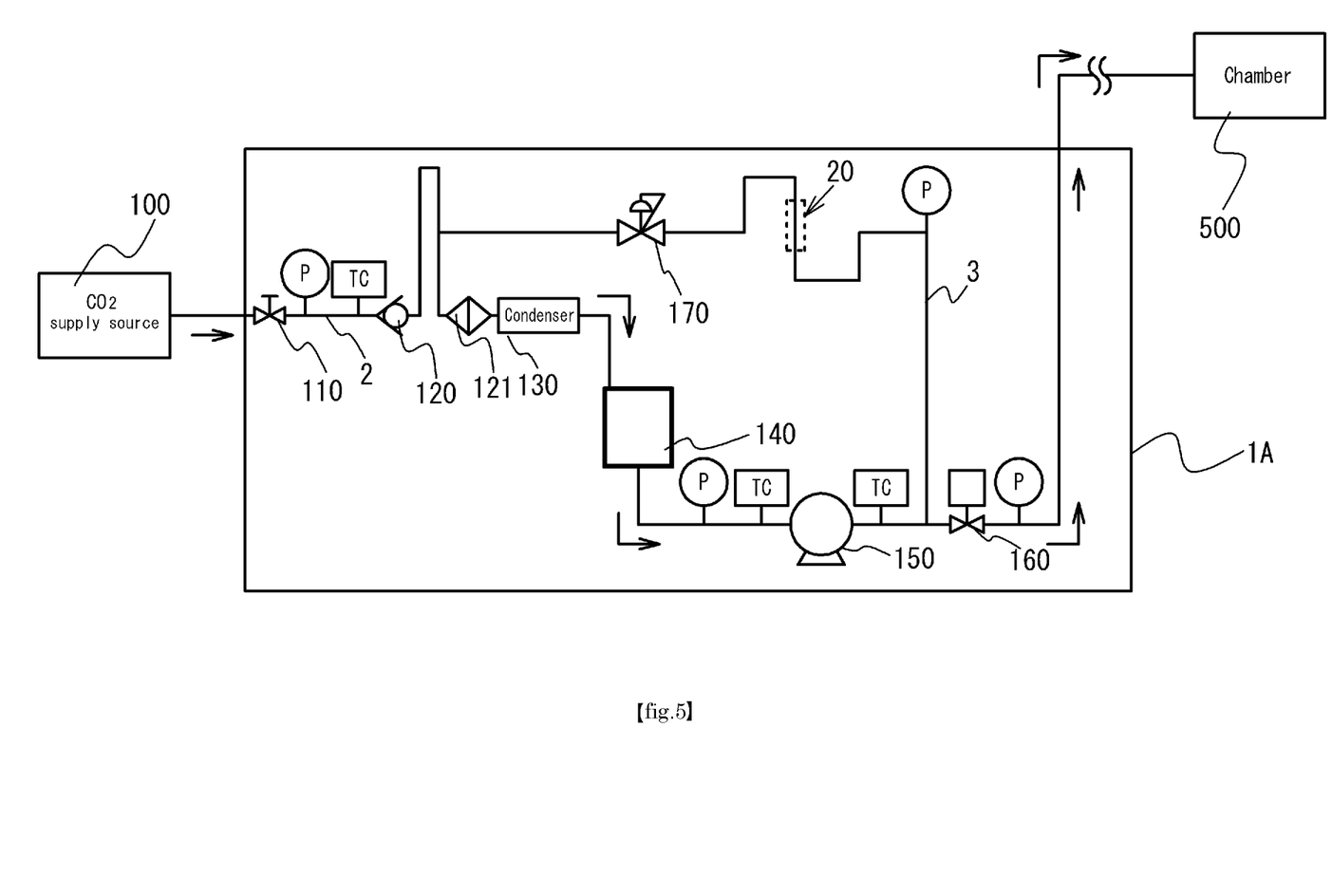
FIG. 5 is a configuration diagram of a fluid supply device according to another embodiment of the present invention.

FIG. 5 illustrates a fluid supply device 1A according to another embodiment of the present invention. It should be noted that, in FIG. 5, the same components as those in FIG. 1A are denoted using the same reference numerals.

In the fluid supply device 1A, the extended heat transfer tube part 10 does not exist, and the heating means 20 heats the liquid in the branching flow path 3 to partially change the liquid to a supercritical fluid.

According to such a configuration, the extended heat transfer tube part 10 is not required, and the device configuration can be simplified.

While a case in which the extended heat transfer tube part 10 and the heating means 20 are provided to the branching flow path 3 is given as an example in each of both embodiments described above, the present invention is not necessarily limited thereto, and the extended heat transfer tube part 10 can be provided in a middle of the main flow path 2 on the discharge side of the pump 150 as well.

While carbon dioxide is illustrated as the fluid pressurized and fed to the processing chamber by the pump in the above-described embodiments, the present invention is not necessarily limited thereto and is applicable as long as the fluid is one that can be changed to a supercritical state, such as water, methane, ethane, propane, methanol, or ethanol, for example.

DESCRIPTIONS OF REFERENCE NUMERALS 1, 1A Fluid supply device
2 Main flow path
3 Branching flow path
10, 10B, 10C Extended heat transfer tube part
11 Spiral tube
20 Heating means
30 Orifice
100 $CO_2$ supply source
110 Switch valve
120 Check valve
121 Filter
130 Condenser
140 Tank
150 Pump
160 Automatic switch valve
170 Back pressure valve
500 Processing chamber

What is claimed is:

1. A fluid supply device for supplying a fluid in a liquid state toward a processing chamber, comprising:
    a condenser that liquefies a fluid in a gas state;
    a tank that stores the fluid liquefied by the condenser;
    a pump that pressure-feeds the liquefied fluid stored in the tank toward the processing chamber;
    a flow path that branches from a branch point between the pump and a switch valve provided in a middle of a flow path from a discharge side of the pump to the processing chamber, the flow path thus branched being a branched flow path to return the liquefied fluid discharged from the pump to the condenser;
    a back pressure valve provided to the branched flow path and configured to release the liquefied fluid on the discharge side of the pump to a side of the condenser when a pressure of the liquefied fluid becomes a predetermined pressure or more;
    an extended heat transfer tube part having an increased heat transfer area and provided between the back pressure valve and the branch point in the branched flow path; and
    a heater provided to the extended heat transfer tube part and to partially change the liquefied fluid in the branched flow path to a supercritical fluid.

2. The fluid supply device according to claim 1, wherein the extended heat transfer tube part includes any one of a spiral tube, a helical tube, a corrugated tube, a plate-type tube, and a multi-tube-type tube, or a combination thereof.

3. The fluid supply device according to claim 1, wherein the fluid can be changed to a supercritical state.

4. A fluid supply method comprising using the fluid supply device described in claim 1 to supply the fluid in the liquid state toward the processing chamber.

5. A semiconductor manufacturing system that processes a substrate using a fluid supplied from the fluid supply device described in claim 1.

* * * * *